United States Patent
Park et al.

(10) Patent No.: US 8,963,243 B2
(45) Date of Patent: Feb. 24, 2015

(54) P-CHANNEL LDMOS TRANSISTOR AND METHOD OF PRODUCING A P-CHANNEL LDMOS TRANSISTOR

(75) Inventors: Jong Mun Park, Graz (AT); Martin Knaipp, Unterpremstatten (AT)

(73) Assignee: AMS AG, Unterpremstaetten (AT)

( * ) Notice: Subject to any disclaimer, the term of this patent is extended or adjusted under 35 U.S.C. 154(b) by 0 days.

(21) Appl. No.: 13/807,287

(22) PCT Filed: May 24, 2011

(86) PCT No.: PCT/EP2011/058459
§ 371 (c)(1),
(2), (4) Date: Mar. 14, 2013

(87) PCT Pub. No.: WO2012/000723
PCT Pub. Date: Jan. 5, 2012

(65) Prior Publication Data
US 2013/0168769 A1    Jul. 4, 2013

(30) Foreign Application Priority Data

Jul. 1, 2010  (EP) .................................... 10006806

(51) Int. Cl.
*H01L 29/78* (2006.01)
*H01L 29/10* (2006.01)
(Continued)

(52) U.S. Cl.
CPC ......... *H01L 29/7816* (2013.01); *H01L 29/0653* (2013.01); *H01L 29/1083* (2013.01); *H01L 29/66659* (2013.01); *H01L 29/7835* (2013.01); *H01L 29/66681* (2013.01)
USPC ............ 257/343; 257/E29.256; 257/E29.261; 438/286; 438/306

(58) Field of Classification Search
CPC ............ H01L 29/1083; H01L 29/7816; H01L 29/7835; H01L 29/66681; H01L 29/66659; H01L 29/0653
USPC .................. 257/336, 343, E29.256, E29.261; 438/286, 306
See application file for complete search history.

(56) References Cited

U.S. PATENT DOCUMENTS 5,322,804 A * 6/1994 Beasom ......................... 438/227
5,349,225 A * 9/1994 Redwine et al. ............... 257/336
(Continued)

FOREIGN PATENT DOCUMENTS

| EP | 2 402 998 A1 * | 4/2012 | .............. H01L 29/78 |
| WO | 2005/083794 A2 | 9/2005 | |
| WO | WO 2009/101150 A1 * | 8/2009 | .............. H01L 29/06 |

OTHER PUBLICATIONS

Kitamura et al., "Self-Isolated and High Performance Complementary Lateral DMOSFETs with Surrounding-Body Regions", Proceedings of the 7th International Symposium on Power Semiconductor Devices and IC's (ISPDS), Yokohama, JP, May 23-25, 1995, May 23, 1995, pp. 42-47.

*Primary Examiner* — Mary Wilczewski
(74) *Attorney, Agent, or Firm* — McDermott Will & Emery LLP

(57) ABSTRACT

The p-channel LDMOS transistor comprises a semiconductor substrate (1), an n well (2) of n-type conductivity in the substrate, and a p well (3) of p-type conductivity in the n well. A portion of the n well is located under the p well. A drain region (4) of p-type conductivity is arranged in the p well, and a source region (9) of p-type conductivity is arranged in the n well. A gate dielectric (7) is arranged on the substrate, and a gate electrode (8) is arranged on the gate dielectric. A body contact region (14) of n-type conductivity is arranged in the n well. A p implant region (17) is arranged in the n well under the p well in the vicinity of the p well. The p implant region locally compensates n-type dopants of the n well.

7 Claims, 2 Drawing Sheets

(51) Int. Cl.
*H01L 29/66* (2006.01)
*H01L 29/06* (2006.01)

(56) References Cited

U.S. PATENT DOCUMENTS

| | | | | |
|---|---|---|---|---|
| 5,485,027 | A * | 1/1996 | Williams et al. | 257/343 |
| 5,498,554 | A * | 3/1996 | Mei | 438/200 |
| 5,501,994 | A * | 3/1996 | Mei | 438/200 |
| 5,512,495 | A * | 4/1996 | Mei et al. | 438/286 |
| 6,521,962 | B2 * | 2/2003 | Evans | 257/409 |
| 6,882,023 | B2 * | 4/2005 | Khemka et al. | 257/493 |
| 6,897,525 | B1 * | 5/2005 | Kikuchi et al. | 257/343 |
| 6,958,515 | B2 * | 10/2005 | Hower et al. | 257/341 |
| 7,445,979 | B2 * | 11/2008 | Williams et al. | 438/199 |
| 7,663,203 | B2 | 2/2010 | Knaipp | |
| 7,732,863 | B2 * | 6/2010 | Pendharkar et al. | 257/343 |
| 7,750,401 | B2 * | 7/2010 | Cai | 257/335 |
| 8,217,452 | B2 * | 7/2012 | Toren et al. | 257/335 |
| 8,330,220 | B2 * | 12/2012 | Khan et al. | 257/343 |
| 8,338,872 | B2 * | 12/2012 | Khemka et al. | 257/299 |
| 2002/0072186 | A1 | 6/2002 | Evans | |
| 2003/0040160 | A1 * | 2/2003 | Huang et al. | 438/316 |
| 2004/0004258 | A1 | 1/2004 | Fujita | |
| 2004/0238913 | A1 * | 12/2004 | Kwon et al. | 257/492 |
| 2005/0253216 | A1 * | 11/2005 | Tsuchiko | 257/491 |
| 2005/0258496 | A1 * | 11/2005 | Tsuchiko | 257/378 |
| 2009/0140372 | A1 * | 6/2009 | Hodel et al. | 257/500 |
| 2011/0198690 | A1 * | 8/2011 | Hu et al. | 257/336 |
| 2011/0233672 | A1 * | 9/2011 | Chang et al. | 257/339 |
| 2011/0266614 | A1 * | 11/2011 | Khan et al. | 257/328 |
| 2012/0267717 | A1 * | 10/2012 | Toren et al. | 257/339 |
| 2013/0168769 | A1 * | 7/2013 | Park et al. | 257/343 |
| 2014/0167158 | A1 * | 6/2014 | Pan et al. | 257/338 |

* cited by examiner

P-CHANNEL LDMOS TRANSISTOR AND METHOD OF PRODUCING A P-CHANNEL LDMOS TRANSISTOR

A p-channel LDMOS transistor comprises an n-well in a semiconductor substrate and a p-well arranged within the n-well. A source contact region, which is highly p-doped, is arranged in the n-well, and a drain contact region, which is also highly p-doped, is arranged in the p-well. A body contact is applied to the n-well.

The high-voltage performance of a p-channel LDMOS transistor is affected by the device breakdown voltage, which is determined by the lateral break down voltage and the vertical breakdown voltage. One of these breakdown voltages is related to a punch-through behavior and can be determined by applying a negative voltage to the drain contact with respect to the substrate and the source and body contacts, which may be grounded. The corresponding breakdown voltage is relatively high in absolute value, or no punch-through occurs at all, if the n-well comprises a relatively high doping concentration. In this case, however, the device breakdown voltage, which can be measured by applying a negative voltage both to the drain contact and to the substrate while grounding source and body, is limited by the vertical p-well/n-well junction breakdown voltage. The device breakdown voltage is essentially higher if the n-well comprises a low doping concentration. But in this case, the punch-through occurs at much lower absolute voltage values.

A low doping concentration of the n-well has the further disadvantages that the on-resistance of the transistor is relatively high and an optimization of a relatively high doping concentration in the p-well is rendered difficult. Therefore, a high doping concentration is preferred in the n-well.

The occurrence of a punch-through could in principle be suppressed by increasing the depth of the n-well within the substrate. This option requires either an epitaxial growth or a high-energy n-well implantation and is therefore avoided in view of process complexity and fabrication costs.

It is an object of the present invention to provide a p-channel LDMOS transistor having low on-resistance and improved punch-through behavior. It is a further object to present a method of producing such an LDMOS transistor.

These objects are achieved with the p-channel LDMOS transistor according to claim 1 and with the method of producing a p-channel LDMOS transistor according to claim 8, respectively. Embodiments and variants derive from the dependent claims.

The p-channel LDMOS transistor comprises a semiconductor substrate, an n well of n-type conductivity in the substrate, and a p well of p-type conductivity in the n well. A portion of the n well is located under the p well. A drain region of p-type conductivity is arranged in the p well, and a source region of p-type conductivity is arranged in the n well. A gate dielectric is arranged on the substrate, and a gate electrode is arranged on the gate dielectric. A body contact region of n-type conductivity is arranged in the n well. A p implant region is arranged in the n well under the p well in the vicinity of the p well. The p implant region locally compensates n-type dopants of the n well.

In an embodiment of the LDMOS transistor the p implant region is adjacent to the p well.

In a further embodiment of the LDMOS transistor a shallow n well is arranged in the n well, and the source region and the body contact region are arranged in the shallow n well.

In a further embodiment of the LDMOS transistor the shallow n well is arranged at a distance from the p well.

In a further embodiment of the LDMOS transistor the p well, the gate electrode and the source region are arranged symmetrically with respect to the position of the drain region.

In a further embodiment of the LDMOS transistor, a drift region is located in the p well, and an isolation region is embedded in the p well. The isolation region is arranged above the drift region between the drain region and the source region.

In a further embodiment of the LDMOS transistor an isolation region is arranged between the source region and the body contact region.

The method of producing a p-channel LDMOS transistor comprises the steps of forming an n well in a semiconductor substrate by an implantation of n-dopants, forming a p well in the n well by an implantation of p-dopants, and forming a p implant region in the n well under the p well in the vicinity of the p well by a further implantation of p-dopants. By an implantation of p-dopants, a drain region is formed in the p well, and a source region is formed in the n well.

The further implantation of p-dopants forming the p implant region may be performed typically at an energy between 500 keV and 800 keV, particularly at an energy between 600 keV and 700 keV, for example.

The p implant region can be arranged under a section of the p well that is provided as a drift region. An isolation region may be arranged in the p well above the drift region between the drain region and the source region.

In a further variant of the method a shallow n well is formed at a distance from the p well by a further implantation of n-dopants. The source region and the body contact region are arranged in the shallow n well.

The following is a detailed description of examples of the p-channel LDMOS transistor and of the method of producing a p-channel LDMOS transistor, in conjunction with the appended figures.

Figure 1:
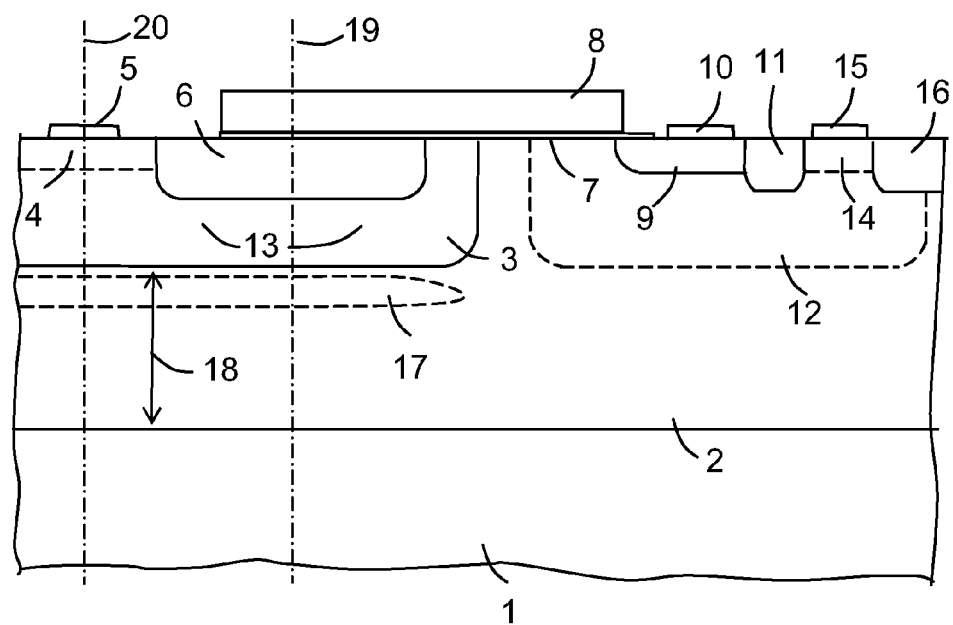
FIG. 1 shows a cross-section of an embodiment of the p-channel LDMOS transistor.

FIG. 1 shows a cross-section of an embodiment of the LDMOS transistor according to the invention. A semiconductor substrate 1, which may have a basic p-doping, is provided with an n-well 2 of n-type conductivity and a p-well 3 of p-type conductivity arranged within the n-well 2. A drain region 4, which is more highly p-doped, is arranged in the p-well 3 at an upper surface of the substrate 1. A drain contact 5 is applied to the drain region 4. An isolation region 6 is arranged in the p-well 3 adjacent to the drain region 4. A portion of the p-well 3 that is located under the isolation region 6 is provided as drift region 13. On the upper surface of the substrate 1, a gate electrode 8 is arranged on a gate dielectric 7. A source region 9, which is highly p-doped, is arranged at a distance from the p-well 3. A source contact 10 is applied to the source region 9. The n-well 2 is provided with a highly n-doped body contact region 14, on which a body contact 15 is applied. The source region 9 and the body contact region 14 may be arranged in a shallow n-well 12. Further isolation regions 11 and 16 may be provided to separate the source region 9 from the body contact region 14 and to separate the transistor from further components on the same substrate 1.

A p implant region 17 is provided under the p-well 3, particularly under the drift region 13, and in the vicinity of the pn-junction between the n-well 2 and the p-well 3. The p implant region 17 may be arranged adjacent to the p-well 3 or at a sufficiently small distance under the p-well 3. The p implant region 17 locally reduces the n-type conductivity of the n-well 2 without generating a net p-type conductivity in the n-well 2. Here, a counter doping effect is used, by which the n-type conductivity generated by the n-dopants in the n-well is partially compensated by the effect of the p-dopants of the p implant region 17.

The p implant region 17 improves the punch-through behaviour of the transistor without requiring an increase of the distance 18 between the p-well 3 and the lower boundary of the n-well 2. The depth of the n-well 2 can therefore be similar to that of conventional LDMOS transistors. The structure of the device may be arranged to be symmetric with respect to the location of the drain contact 5. The position of a plane 20 of symmetry is indicated by the cross-section of the plane 20 in FIG. 1. The doping profile along the section 19 through the drift region 13 and the p implant region 17 is schematically represented in the diagram of FIG. 2.

Figure 2:
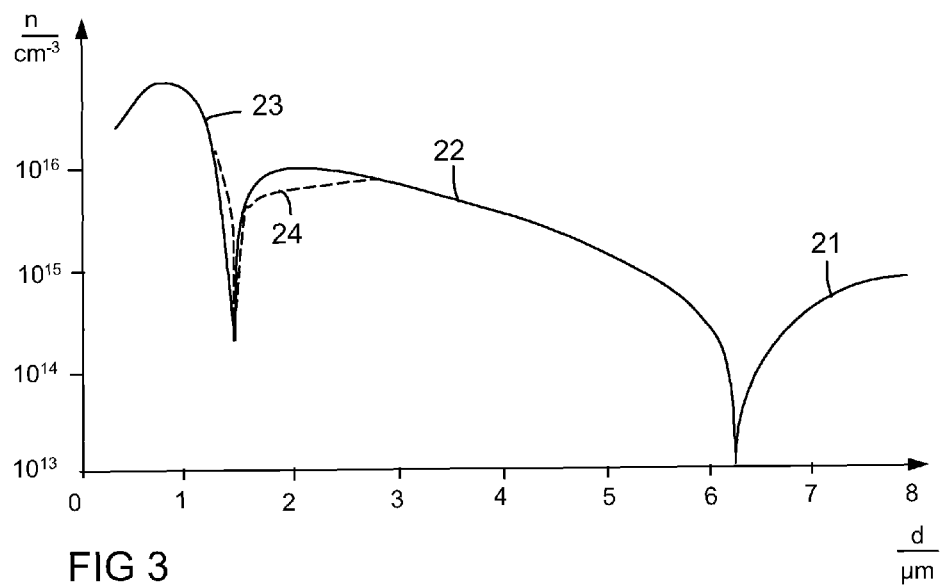
FIG. 2 shows a diagram of an example of the doping profile.
Figure 3:
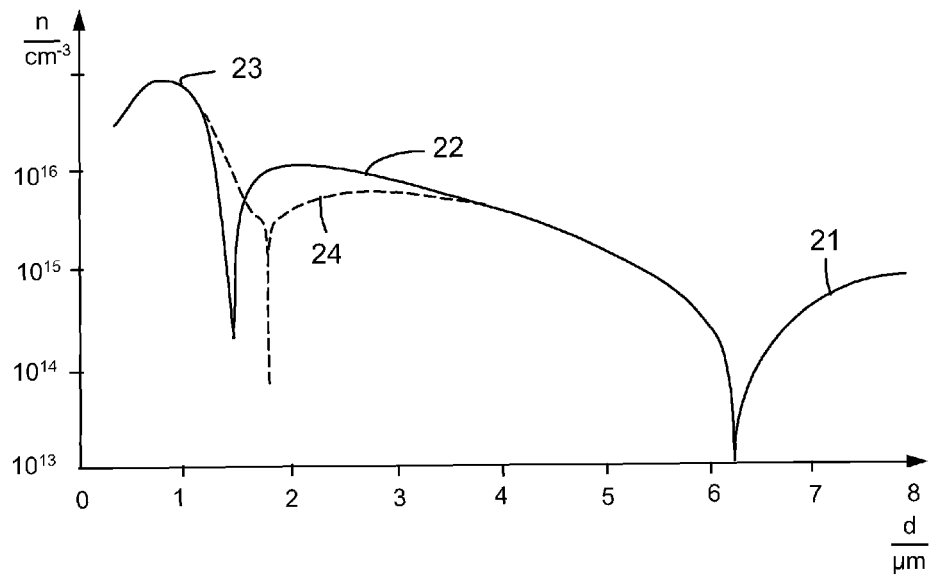
FIG. 3 shows a diagram of a further example of the doping profile.

FIGS. 2 and 3 show diagrams of examples of the doping concentration, measured in number n of dopants per $cm^3$, as a function of the depth d, measured in μm vertically from the upper surface of the substrate 1 down into the substrate 1. The curves drawn in the diagrams show typical doping profiles of the substrate doping 21, the n-well doping 22 and the p-well doping 23. The doping concentration here means the net doping, which may result from a partial compensation of the doping because of the counter-doping effect. The broken lines show the n-well doping 24 for transistors comprising a p implant region 17.

There is a peak of the concentration of the n-well doping 22 at a depth d of approximately 2 μm, just below the p well 3. A p implant region 17 decreases the net concentration of the n-well doping 24 in the neighbourhood of this peak. This modification of the doping profile increases the vertical breakdown voltage at the pn-junction between the n-well 2 and the p-well 3. One reason for this may be that the depletion layer at the pn-junction is vertically enlarged owing to the modification of the doping profile.

A further advantage obtained with the p implant region 17 is a reduction of the on-resistance of the transistor. Furthermore, variations of the breakdown voltage, which may occur because of different resistivities of the substrates, can also be reduced.

FIG. 3 shows an example of the doping profile in which the pn-junction between the n-well 2 and the p-well 3 is shifted by the p implant region 17 and is located at a larger distance from the upper surface of the substrate 1, corresponding to a larger value of the depth d.

LIST OF REFERENCE NUMERALS 1 substrate
2 n well
3 p well
4 drain region
5 drain contact
6 isolation region
7 gate dielectric
8 gate electrode
9 source region
10 source contact
11 isolation region
12 shallow n well
13 drift region
14 body contact region
15 body contact
16 isolation region
17 p implant region
18 distance
19 section
20 plane of symmetry
21 substrate doping
22 n well doping
23 p well doping
24 n well doping with p implant

The invention claimed is:

1. A p-channel LDMOS transistor, comprising:
   a semiconductor substrate;
   an n well of n-type conductivity in the substrate;
   a p well of p-type conductivity in the n well, a portion of the n well being located under the p well;
   a drain region of p-type conductivity in the p well;
   a gate dielectric on the substrate;
   a gate electrode on the gate dielectric;
   a source region of p-type conductivity in the n well;
   a body contact region of n-type conductivity in the n well;
   a p implant region arranged in the n well under the p well in the vicinity of the p well, the p implant region locally compensating n-type dopants of the n well; and
   a drift region located in the p well.

2. The LDMOS transistor of claim 1, wherein the p implant region is adjacent to the p well.

3. The LDMOS transistor of claim 1 or 2, further comprising:
   a shallow n well in the n well, the source region and the body contact region being arranged in the shallow n well.

4. The LDMOS transistor of claim 3, wherein the shallow n well is arranged at a distance from the p well.

5. The LDMOS transistor of claim 1, wherein the p well, the gate electrode and the source region are arranged symmetrically with respect to the position of the drain region.

6. The LDMOS transistor of claim 1, further comprising:
   an isolation region embedded in the p well,
   the isolation region being arranged above the drift region between the drain region and the source region.

7. The LDMOS transistor of claim 1, further comprising:
   an isolation region between the source region and the body contact region.

* * * * *